United States Patent
Brillhart et al.

(10) Patent No.: US 7,660,893 B2
(45) Date of Patent: Feb. 9, 2010

(54) METHOD AND SYSTEM FOR MONITORING AND INSTANTLY IDENTIFYING FAULTS IN DATA COMMUNICATION CABLES

(75) Inventors: David Clark Brillhart, Orlando, FL (US); Christopher James Dawson, Arlington, VA (US); Michael David Kendzierski, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 330 days.

(21) Appl. No.: 11/849,381

(22) Filed: Sep. 4, 2007

(65) Prior Publication Data

US 2009/0063674 A1 Mar. 5, 2009

(51) Int. Cl.
G06F 15/173 (2006.01)
H04L 12/26 (2006.01)
(52) U.S. Cl. .............. 709/224; 714/4; 714/48; 324/542; 359/341.44; 340/691.1; 370/242
(58) Field of Classification Search ........... 709/223, 709/224; 714/4, 47, 48, 821; 324/500, 755, 324/542; 359/341.44; 340/691.1; 370/241, 370/242, 248, 252, 253
See application file for complete search history.

(56) References Cited

U.S. PATENT DOCUMENTS

| 3,781,665 A | 12/1973 | Gale |
| 4,012,149 A | 3/1977 | Bouillie et al. |
| 6,108,475 A * | 8/2000 | Chapin et al. ............... 385/128 |
| 6,559,657 B1 | 5/2003 | McCarthy et al. |
| 6,825,670 B2 | 11/2004 | Bussinger |
| 7,027,217 B2 | 4/2006 | Kanou |
| 2004/0146254 A1* | 7/2004 | Morrison .................... 385/100 |
| 2005/0023026 A1* | 2/2005 | Chen ........................ 174/74 R |
| 2005/0184738 A1 | 8/2005 | Weaver |

FOREIGN PATENT DOCUMENTS

JP 2003-32189 1/2003

OTHER PUBLICATIONS

Hyland, RN et al.; Remote Detection of Conductor Failure; IBM Technical Disclosure Bulletin; Dec. 1973; pp. 2265-2266; www.delphion.com/tdbs/tdb.

* cited by examiner

Primary Examiner—David Lazaro
(74) Attorney, Agent, or Firm—Schmeiser, Olsen & Watts; John R. Pivnichny (57) ABSTRACT

A method and an associated system for monitoring and instantly identifying faults in a data communication cable are disclosed. A fault monitoring program learns a reference data traffic pattern communicated through the data communication cable by reading inputs from a sensor. The reference data traffic pattern is stored and is used for determining normalcy of data traffic through the data communication cable. The fault monitoring program monitors for a fault in a data traffic, and, if a fault is detected, activates a fault indicator sending out fault signals to notify users of the fault. If the fault is not recovered within a predefined recovery period, the fault monitoring program deactivates the fault indicator and shuts down a power source for later use of the data communication cable.

28 Claims, 3 Drawing Sheets

METHOD AND SYSTEM FOR MONITORING AND INSTANTLY IDENTIFYING FAULTS IN DATA COMMUNICATION CABLES

FIELD OF THE INVENTION

The present invention discloses a method and system for monitoring and instantly identifying faults in a data communication cable.

BACKGROUND OF THE INVENTION

Conventional data communication cables employed in a computer network environment may fail to transmit data signals. In contemporary computer network environments, there are numerous data communication cables with identical exteriors. To locate a faulty cable, it is necessary to manually track a data communication cable from a suspected computer suffering a communication problem, or, to manually test all suspicious data communication cables if manual tracking is impossible. Also, in manual testing, all computers that are linked through any suspicious data communication cable should also be removed from the network during the test, which results in a costly disruption of a normal operation. These methods for identifying a faulty data communication cable are time consuming, labor intensive, and increase the risk of accidentally causing data communication loss between networked computers.

Thus, there is a need to overcome at least one of the preceding disadvantages of current methods and systems for identifying faults in data communication cables.

SUMMARY OF THE INVENTION

The present invention provides a method for monitoring and instantly identifying faults in a data communication cable within a computer network comprising a cable medium, a cable insulation, and a fault monitoring system, wherein the fault monitoring system comprises a sensor, a fault monitoring program, a reference data traffic pattern storage, a fault indicator, and a power source, the method comprising:

establishing a reference data traffic pattern by storing data signals into the reference data traffic pattern storage for a predefined sampling period, wherein data signals are input from the sensor;

monitoring for a fault in a data traffic communicated through the cable medium;

activating the fault indicator to notify users that the fault has been detected in response to said monitoring;

checking for a recovery of the data traffic subsequent to said activating for a predefined recovery period; and iteratively looping back to said monitoring, said activating, and said checking, wherein said establishing, said monitoring, said activating, said checking and said iterative looping are performed by the fault monitoring program that runs on a computer system, wherein the sensor of the fault monitoring system transmits data signals communicated through the cable medium to the fault monitoring program, wherein the fault indicator emits audio, visual, or data signals outside of the cable insulation only when the fault indicator is activated.

The present invention provides a computer program product, comprising a computer usable medium having a computer readable program code embodied therein, said computer readable program code containing instructions that when executed by a processor of a computer system implement a method for monitoring and instantly identifying faults in a data communication cable within a computer network comprising a cable medium, a cable insulation, and a fault monitoring system, wherein the fault monitoring system comprises a sensor, a fault monitoring program, a reference data traffic pattern storage, a fault indicator, and a power source, the method comprising:

establishing a reference data traffic pattern by storing data signals into the reference data traffic pattern storage for a predefined sampling period, wherein data signals are input from the sensor;

monitoring for a fault in a data traffic communicated through the cable medium;

activating the fault indicator to notify users that the fault has been detected in response to said monitoring;

checking for a recovery of the data traffic subsequent to said activating for a predefined recovery period; and iteratively looping back to said monitoring, said activating, and said checking, wherein said establishing, said monitoring, said activating, said checking and said iterative looping are performed by the fault monitoring program that runs on a computer system, wherein the sensor of the fault monitoring system transmits data signals communicated through the cable medium to the fault monitoring program, wherein the fault indicator emits audio, visual, or data signals outside of the cable insulation only when the fault indicator is activated.

The present invention provides a computer system comprising a processor and a computer readable memory unit coupled to the processor, said memory unit containing instructions that when executed by the processor implement a method for monitoring and instantly identifying faults in a data communication cable within a computer network comprising a cable medium, a cable insulation, and a fault monitoring system, wherein the fault monitoring system comprises a sensor, a fault monitoring program, a reference data traffic pattern storage, a fault indicator, and a power source, the method comprising:

establishing a reference data traffic pattern by storing data signals into the reference data traffic pattern storage for a predefined sampling period, wherein data signals are input from the sensor;

monitoring for a fault in a data traffic communicated through the cable medium;

activating the fault indicator to notify users that the fault has been detected in response to said monitoring;

checking for a recovery of the data traffic subsequent to said activating for a predefined recovery period; and iteratively looping back to said monitoring, said activating, and said checking, wherein said establishing, said monitoring, said activating, said checking and said iterative looping are performed by the fault monitoring program that runs on a computer system, wherein the sensor of the fault monitoring system transmits data signals communicated through the cable medium to the fault monitoring program, wherein the fault indicator emits audio, visual, or data signals outside of the cable insulation only when the fault indicator is activated.

The present invention provides a process for supporting computer infrastructure, said process comprising providing at least one support service for at least one of creating, integrating, hosting, maintaining, and deploying computer-readable code in a computing system, wherein the code in combination with the computing system is capable of performing a method for monitoring and instantly identifying faults in a data communication cable within a computer network comprising a cable medium, a cable insulation, and a fault monitoring system, wherein the fault monitoring system comprises a sensor, a fault monitoring program, a reference data traffic pattern storage, a fault indicator, and a power source, the method comprising:

establishing a reference data traffic pattern by storing data signals into the reference data traffic pattern storage for a predefined sampling period, wherein data signals are input from the sensor;

monitoring for a fault in a data traffic communicated through the cable medium;

activating the fault indicator to notify users that the fault has been detected in response to said monitoring;

checking for a recovery of the data traffic subsequent to said activating for a predefined recovery period; and iteratively looping back to said monitoring, said activating, and said checking, wherein said establishing, said monitoring, said activating, said checking and said iterative looping are performed by the fault monitoring program that runs on a computer system, wherein the sensor of the fault monitoring system transmits data signals communicated through the cable medium to the fault monitoring program, wherein the fault indicator emits audio, visual, or data signals outside of the cable insulation only when the fault indicator is activated.

The present invention provides a method and system that overcomes at least one of the current disadvantages of conventional method and system for identifying faults in data communication cables.

DETAILED DESCRIPTION OF THE INVENTION

Figure 1:
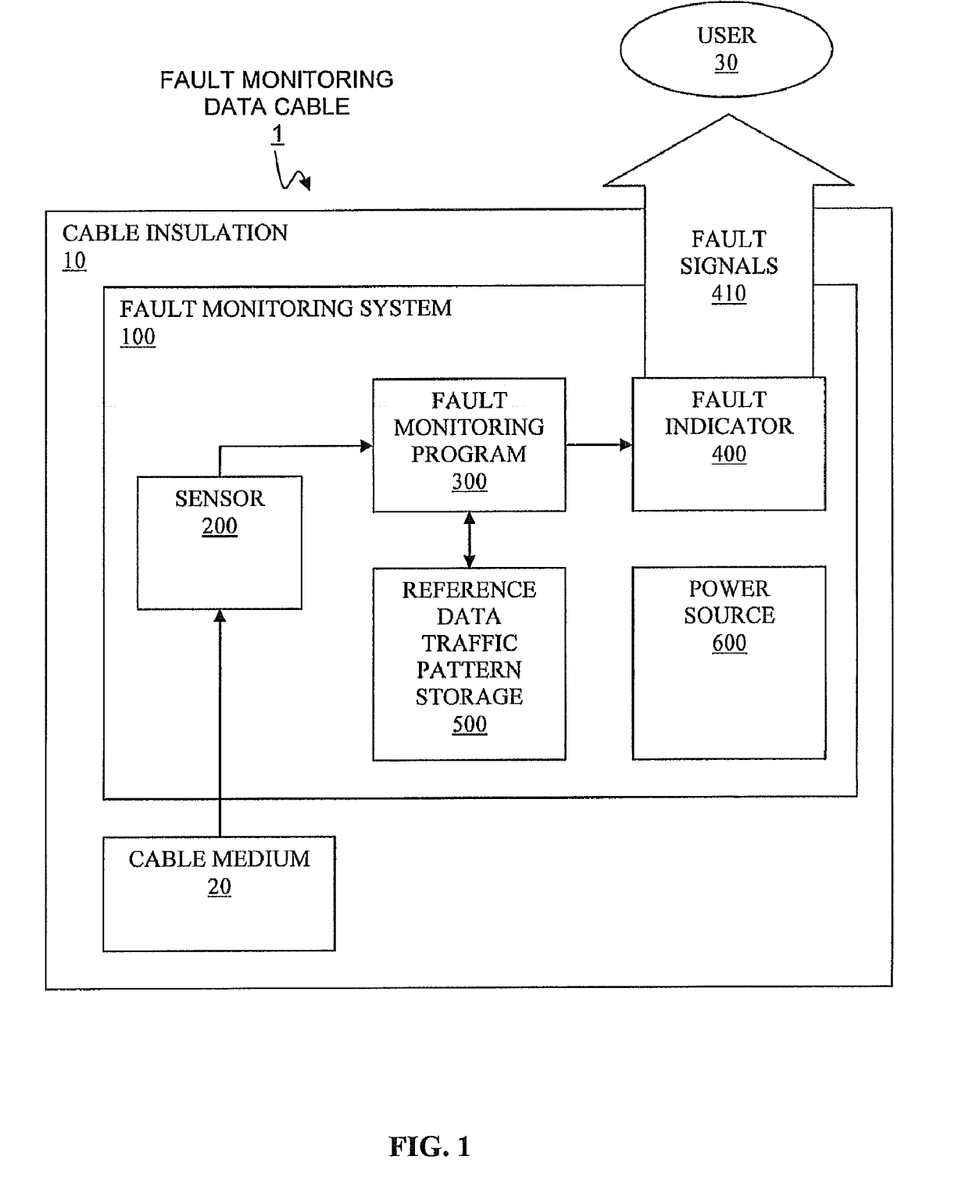
FIG. 1 illustrates a fault monitoring data communication cable for instantly identifying faults in a data communication cable, in accordance with embodiments of the present invention.

FIG. 1 illustrates a fault monitoring data communication cable 1 for instantly identifying faults in a data communication cable, in accordance with embodiments of the present invention.

A computer network is defined as a network of data processing nodes that are interconnected for the purpose of data communication. Data processing nodes may, inter alia, input, output, transform, receive, and/or transmit data. A network is defined as an interconnection of two or more communicating entities. Regardless of data processing capacity of a node or an entity, in this specification, the term computer network is used interchangeably with the term network. Data communication is indispensable in contemporary computing environments. Thus, when a computer network fails, it is necessary to recover the failed computer network as soon as possible. When a communication failure in a computer network is caused by a problem with a data communication cable, the first step is to identify the data communication cable.

The present invention provides a method and system to instantly identify a data communication cable that does not transmit data signals by monitoring data traffic patterns in the data communication cable. When a data communication cable is disconnected from network devices, when a transferring medium of a data communication cable is broken, or when a data communication cable using an electric medium is short circuited out to adjacent conducting materials, a data traffic pattern varies from a data traffic pattern with normal data communication. When the present invention detects an abnormal data traffic pattern, the present invention identifies the data communication cable with such abnormality by activating a fault indicator.

A data communication cable of the present invention incorporates a fault indicator which may use, inter alia, a visual indication upon failure through an emission of light as in an electroluminescence or a light emitting diode (LED), an audio alert such as a beep, etc. The present invention enables a user to instantly identify a faulty data communication cable without either manually tracking a data communication cable or disrupting data communication required in a test of all suspicious data communication cables. Thus, the present invention will save time for recovery, network maintenance expenses, and other resources that would otherwise be wasted on the troubleshooting of determining which data communication cable has failed.

The fault monitoring data communication cable 1 of the present invention comprises a cable medium 20, a cable insulation 10, and a fault monitoring system 100, wherein the fault monitoring system 100 is coupled to the cable medium 20 for sensing data signals, and the fault monitoring system 100 notifies a user 30 whether the fault monitoring data communication cable 1 is faulty.

The cable insulation 10 protects the cable medium 20. The fault monitoring system 100 may be integrated within the cable insulation 10 or may be located outside of the cable insulation. The fault monitoring system 100 is coupled to the cable medium 20 so that the fault monitoring system 100 may receive inputs from the cable medium 20. Also, the cable insulation 10 has an outlet so that the fault monitoring system 100 may discharge an audio, visual, and/or data signal to the outside of the cable insulation 10, to notify users of a fault with the fault monitoring data communication cable 1.

The cable medium 20 may be, inter alia, optical fiber, copper wire, etc. The material of the cable medium 20 determines which kind of sensor should be used for the fault monitoring system 100. For example, if the cable medium 20 is an optical fiber, the fault monitoring system 100 uses a photon leak sensor.

The fault monitoring system 100 comprises a sensor 200, a fault monitoring program 300, a fault indicator 400, a reference data traffic pattern storage 500, and a power source 600.

The sensor 200 detects data signal activity along the cable medium 20 or a lack thereof. The sensor 200 is coupled to the cable medium 20 of the fault monitoring data communication cable 1 regardless of a material of the cable medium 20. Data traffic is defined as data signal activities along the cable medium 20, and may be measured by, inter alia, megabytes per second (MBps), bytes per second (Bps), bits per second (bps), etc. The sensor 200 reads signals from data traffic along the cable medium 20 into the fault monitoring program 300 as inputs. In one embodiment, the sensor 200 detects data rates of data traffic along the cable medium 20 and passes the rates read to the fault monitoring program 300 without passing the actual data traffic.

In a first embodiment of the present invention, the sensor 200 may be, inter alia, a photon leak sensor that is implemented to detect activities within a core of optical fiber cables. In case of an optical fiber cable, the sensor must have direct line-of-sight to the glass optical core of a fiber to detect or to sample leakage photons traveling through the glass medium. A microscopic scratch or notch could be made on the surface of the glass medium to enhance the scatter of leakage photons.

In a second embodiment of the present invention, the sensor may be, inter alia, an electric current sensor that is implemented to detect electric current for a metallic (e.g., copper) cable. The electric current sensor is embedded within the cable insulation 10.

In a third embodiment of the present invention, the electric current sensor may be, inter alia, used with an electrical medium of a data communication cable. The electric current sensor may form a "collar" within and/or around an outer sheath covering the data communication cable, such that it works as a sensor for the fault monitoring program 300 that senses the electromagnetic field produced when even a minute electric current flows through the electrical medium of the data communication cable.

Figure 2:
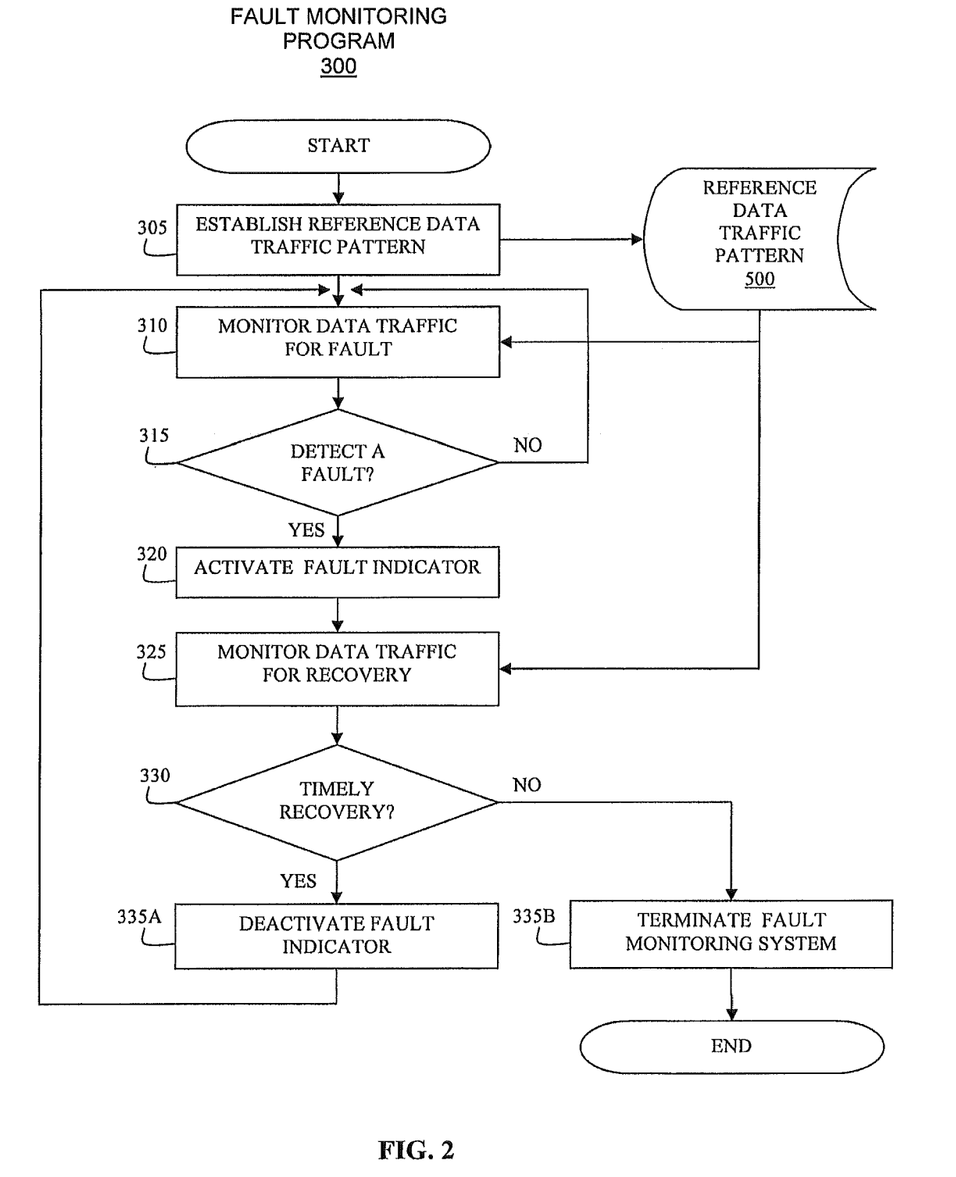
FIG. 2 is a flowchart depicting a method for monitoring and instantly identifying faults in a data communication cable, in accordance with the embodiments of the present invention.

For the description on the fault monitoring program 300, see the flowchart of FIG. 2, infra.

The fault indicator 400 emits fault signals 410 to the outside of the cable insulation 10 so that the user 30 can instantly locate the fault monitoring data communication cable 1 of the present invention, in cases the fault monitoring data communication cable is faulty. The fault signals 410 that are emitted from the fault indicator 400 may be, inter alia, an audio signal, a visual signal, or a data signal, etc. Multiple instances of the fault indicator 400 may be placed throughout the outside of the cable insulation 10 so that the user 30 can immediately locate a faulty data communication cable from fault signals 410.

In a fourth embodiment, the fault indicator 400 is an illumination device such as a light emitting diode (LED) or an electroluminescence that deploys visual signals for fault signals 410. The fault indicator 400 visually identifies a data communication cable by activating the illumination device placed, inter alia, at the end of the data communication cable, or at predefined intervals along the length of the data communication cable. With data communication cables of the present invention, a user can notice a fault of a data communication cable by merely looking at the data communication cable, even without using error reporting functions in a network device such as a network interface card (NIC), a switch port LED, etc.

In a fifth embodiment of the present invention, the fault indicator 400 is a beep emitting audio signals as fault signals 410. The fault indicator 400 using audio signals is useful in spotting a faulty data communication cable where the faulty data communication cable is bundled with other data communication cables so it is difficult for a user to notice any visual signals from a faulty data communication cable.

The fault indicator 400 will send out fault signals 410 upon detecting abnormal data traffics. Abnormal data traffics may be, inter alia, a lack of data traffic, a potentially illicit data traffic, such as a denial-of-service (DoS) attack, or an abnormal amount of packet collisions, etc. A lack of data traffic occurs, inter alia, when a data communication cable has a fault, when a data communication cable is unplugged, or when a network device into which a data communication cable is connected has failed. In effect, the present invention can act as a type of a network intrusion detection system (NIDS) by detecting aforementioned illicit data traffics and/or a lack thereof.

The reference data traffic pattern storage 500 is a memory device to store details of normal data traffic.

The power source 600 is a power supply to operate the fault monitoring system 100. During normal operation, the fault indicator 400 is inactive. Thus the fault indicator does not consume any power. Upon detecting a fault in the data communication cable, the fault indicator 400 is activated and starts consuming power. The power source 600 may be, inter alia, a battery, a capacitor, etc.

FIG. 2 is a flowchart depicting a method for monitoring and instantly identifying faults in a data communication cable, in accordance with the embodiments of the present invention.

The fault monitoring program 300 starts running upon installation of a data communication cable implemented pursuant to the method of the present invention in a new computer network environment.

In step 305, the fault monitoring program establishes a reference data traffic pattern, which will be used as a control in determining whether a data communication cable is faulty. The reference data traffic pattern is a distinctive pattern of a normal data traffic in a particular network environment. Once a data communication cable of the present invention is installed in the particular network environment, the fault monitoring program receives input from the sensor and establishes the reference data traffic pattern, and stores the reference data traffic pattern in the reference data traffic pattern storage.

In one embodiment of the present invention, a sampling period for the reference data traffic pattern is in a range between three to five minutes. The sampling period may be reset after the fault monitoring data communication cable of present invention is redeployed to a new network environment.

In step 310, the fault monitoring program monitors a data traffic communicated through the data communication cable. The fault monitoring program periodically compares the data traffic against the reference data traffic pattern established in step 305.

In step 315, the fault monitoring program determines whether a fault has been detected as specified by, inter alia, a predefined tolerance in the data traffic from the reference data traffic pattern for a predefined comparing period. In one embodiment of the present invention, the predefined comparing period is two minutes. In another embodiment, the comparing period is not predefined but the fault monitoring program compares the data traffic to the reference data traffic pattern upon occurrence of a triggering event such as a change of data rates input from the sensor more than a predefined tolerance.

The predefined tolerance for detecting faults and a predefined tolerance for determining recovery described in step 330, infra, may be different in terms of a range of deviation from the reference data traffic pattern. According to the physical characteristics and/or operational environments of the computer network, the predefined tolerance for detecting faults may be less than or greater than the predefined tolerance for determining recovery, or may be identical to the predefined tolerance for determining recovery.

In step 320, the fault monitoring program activates the fault indicator in response to detecting a fault in step 315. The activated fault indicator may, inter alia, illuminate warning lights on the data communication cable, sound beeps, etc., to notify users the fault detected in step 315. See the description of FIG. 1, supra, for details on the fault indicator.

In step 325, the fault monitoring program continues monitoring the data traffic for and/or after a predefined recovery period to determine whether the data traffic is recovered to the reference data traffic pattern. The fault monitoring program stops comparing the data traffic with the reference data traffic pattern upon recovery of the reference data traffic pattern or upon the expiration of the predefined recovery period.

In one embodiment of the present invention, the predefined recovery period is 96 hours. During the 96-hour recovery period, the fault monitoring program tests the data traffic every minute for the first hour, and then tests the data traffic every hour for the following 95 hours. The aforementioned testing scenario for the 96-hour recovery period is useful in cases that a communication failure with the data communication cable of the present invention will be fixed within the first hour since the communication failure is recognized.

In step 330, the fault monitoring program determines whether the reference data traffic pattern has been recovered within the predefined recovery period. The predefined recovery period is configurable upon installing the data communication cable in the computer network.

If the data traffic does not deviate from the reference data traffic pattern more than a predefined tolerance, the fault monitoring program determines that the data traffic is recovered to the reference data traffic pattern. If the data traffic deviates from the reference data traffic pattern more than the predefined tolerance even after the predefined recovery period, the fault monitoring program determines that the data traffic is not recovered to the reference data traffic pattern.

In one embodiment of the present invention, the predefined tolerance is five percent of a data rate of the reference data traffic pattern. Consequently, if a data rate of the data traffic is within a range of 95 percent to 105 percent of a data rate of the reference data traffic pattern, the fault monitoring program determines that the data traffic is recovered. With the fault monitoring data communication cables of the present invention, any disruption in network communication can be easily detected because the data traffic in a data communication cable with a failure differs from the reference data traffic pattern to a greater extent than the predefined tolerance.

If the fault monitoring program determines that the reference data traffic pattern has been recovered, then, in step 335A, the fault monitoring program deactivates the fault indicator to stop emitting fault signals. The reference data traffic pattern is recovered in cases of, inter alia, where an unplugged data communication cable is plugged back in to an operating network device, or where a data communication cable that is plugged into a network device which is recovered to a normal operation from a previous communication problem. Then the fault monitoring program loops back to step 310 to continue monitoring the data traffic of the data communication cable.

If the fault monitoring program determines that the reference data traffic pattern has not been recovered, then, in step 335B, the fault monitoring program terminates the fault monitoring system by deactivating the fault indicator, resetting the reference data traffic pattern, and then turning off the power source. The fault monitoring program resets the reference data traffic pattern in cases for the data communication cable is relocated to a different network environment with different data traffic patterns.

In one embodiment of the present invention, the predefined recovery period is 96 hours. Thus, if the reference data traffic pattern stored in the reference data traffic pattern storage is not reestablished within 96 hours, the fault monitoring program stops sending out fault signals from the fault indicator, resets the reference data traffic pattern, and turns off the power source. The 96-hour recovery period serves two purposes in providing time long enough to locate a faulty data communication cable in ordinary networking environment, and protecting the power source from being unnecessarily exhausted so that the data communication cable can be used over a longer period of time. As described earlier, the time period for recovery is configurable such that a user of the data communication cable may choose proper recovery period for a networking environment where the data communication cable is deployed.

Figure 3:
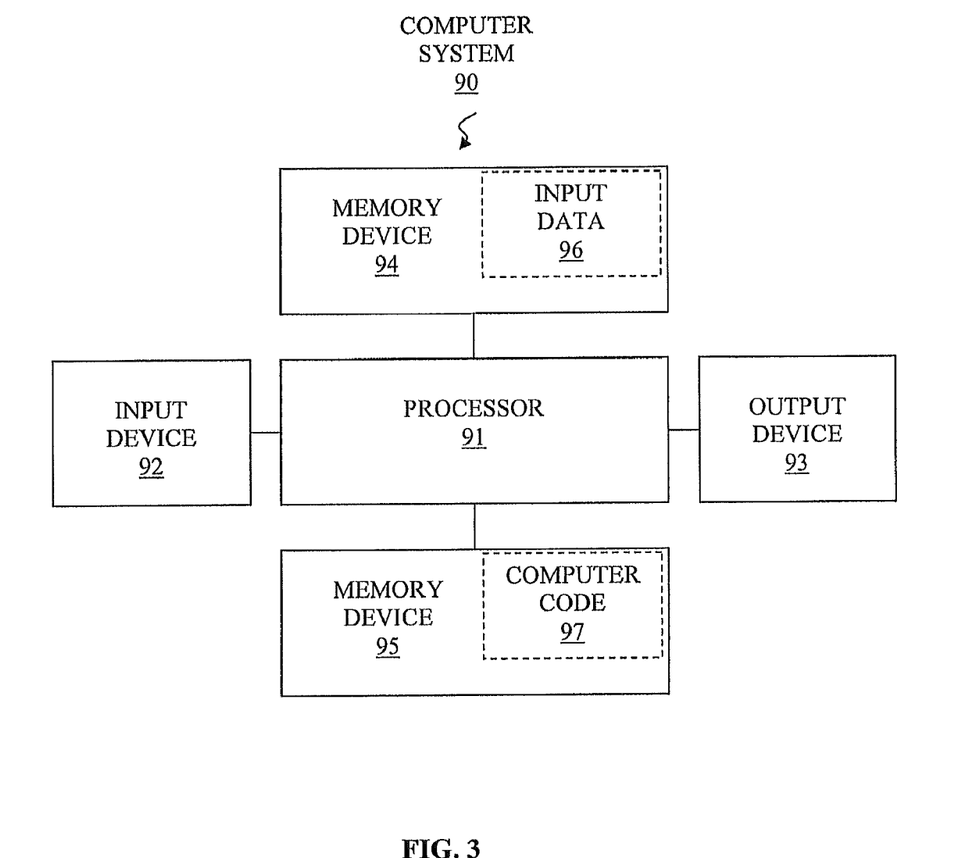
FIG. 3 illustrates a computer system used for monitoring and instantly identifying faults in a data communication cable, in accordance with embodiments of the present invention.

FIG. 3 illustrates a computer system 90 used for monitoring and instantly identifying faults in a data communication cable, in accordance with embodiments of the present invention.

The computer system 90 comprises a processor 91, an input device 92 coupled to the processor 91, an output device 93 coupled to the processor 91, and memory devices 94 and 95 each coupled to the processor 91. The input device 92 may be, inter alia, a keyboard, a mouse, a keypad, a touchscreen, a voice recognition device, a sensor, a network interface card (NIC), a Voice/video over Internet Protocol (VOIP) adapter, a wireless adapter, a telephone adapter, a dedicated circuit adapter, etc. The output device 93 may be, inter alia, a printer, a plotter, a computer screen, a magnetic tape, a removable hard disk, a floppy disk, a NIC, a VOIP adapter, a wireless adapter, a telephone adapter, a dedicated circuit adapter, an audio and/or visual signal generator, a light emitting diode (LED), etc. The memory devices 94 and 95 may be, inter alia, a cache, a dynamic random access memory (DRAM), a read-only memory (ROM), a hard disk, a floppy disk, a magnetic tape, an optical storage such as a compact disc (CD) or a digital video disc (DVD), etc. The memory device 95 includes a computer code 97 which is a computer program that comprises computer-executable instructions. The computer code 97 includes, inter alia, an algorithm used for monitoring and instantly identifying faults in a data communication cable according to the present invention. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices not shown in FIG. 3) may be used as a computer usable medium (or a computer readable medium or a program storage device) having a computer readable program embodied therein and/ or having other data stored therein, wherein the computer readable program comprises the computer code 97. Generally, a computer program product (or, alternatively, an article of manufacture) of the computer system 90 may comprise said computer usable medium (or said program storage device).

Any of the components of the present invention can be deployed, managed, serviced, etc. by a service provider that offers to deploy or integrate computing infrastructure with respect to a process for monitoring and instantly identifying faults in a data communication cable of the present invention. Thus, the present invention discloses a process for supporting computer infrastructure, comprising integrating, hosting, maintaining and deploying computer-readable code into a computing system (e.g., computing system 90), wherein the code in combination with the computing system is capable of performing a method for monitoring and instantly identifying faults in a data communication cable.

In another embodiment, the invention provides a business method that performs the process steps of the invention on a subscription, advertising and/or fee basis. That is, a service provider, such as a Solution Integrator, can offer to create, maintain, support, etc. a process for monitoring and instantly identifying faults in a data communication cable of the present invention. In this case, the service provider can create, maintain, support, etc. a computer infrastructure that performs the process steps of the invention for one or more customers. In return, the service provider can receive payment from the customer(s) under a subscription and/or fee agreement, and/or the service provider can receive payment from the sale of advertising content to one or more third parties.

While FIG. 3 shows the computer system 90 as a particular configuration of hardware and software, any configuration of hardware and software, as would be known to a person of ordinary skill in the art, may be utilized for the purposes stated supra in conjunction with the particular computer system 90 of FIG. 3. For example, the memory devices 94 and 95 may be portions of a single memory device rather than separate memory devices.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for monitoring and instantly identifying faults in a data communication cable within a computer network, the data communication cable comprising a cable medium, a cable insulation, and a fault monitoring system, wherein the fault monitoring system comprises a sensor, a fault monitoring program, a reference data traffic pattern storage, a fault indicator, and a power source, the method comprising:

establishing a reference data traffic pattern by storing data signals into the reference data traffic pattern storage for a predefined sampling period, wherein data signals are input from the sensor;

monitoring for a fault in a data traffic communicated through the cable medium based on a comparison of the data traffic and the reference data traffic pattern;

activating the fault indicator to notify users that the fault has been detected in response to said monitoring;

checking for a recovery of the data traffic subsequent to said activating for a predefined recovery period; and iteratively looping back to said monitoring, said activating, and said checking, wherein said establishing, said monitoring, said activating, said checking and said iterative looping are performed by the fault monitoring program that runs on a computer system that is part of the fault monitoring system of the data communication cable, wherein the sensor of the fault monitoring system transmits data signals communicated through the cable medium to the fault monitoring program, wherein the fault indicator emits audio, visual, or data signals outside of the cable insulation only when the fault indicator is activated.

2. The method of claim 1, wherein the predefined sampling period is functionally determined to a value long enough to identify normalcy of communication through the data communication cable, pursuant to characteristics of the computer network.

3. The method of claim 1, said monitoring comprising:

acquiring the data traffic by reading data signals from the sensor;

comparing the data traffic from said acquiring with the reference data traffic pattern stored in the reference data traffic patteren storage;

after said comparing, ascertaining that the data traffic deviates from the reference data traffic pattern by more than a predefined tolerance; and determining that the fault has been detected in response to said ascertaining.

4. The method of claim 3, wherein the predefined tolerance is functionally determined to a data rate value that demonstrates normalcy of the data traffic relative to data traffic rate of the reference data traffic pattern.

5. The method of claim 1, wherein the predefined recovery period is functionally determined to a time period that is long enough to notify users of the fault and that is short enough to save the power source for a later user of the data communication cable, pursuant to characteristics of the computer network.

6. The method of claim 1, said checking comprising:

comparing the data traffic to the reference data traffic pattern for a predefined sampling period during or after the predefined recovery period;

after said comparing, ascertaining that data traffic does not deviate from the reference data traffic pattern by more than a predefined tolerance; and deactivating the fault indicator in response to said ascertaining.

7. The method of claim 1, said checking comprising:

comparing the data traffic to the reference data traffic pattern for a predefined sampling period during or after the predefined recovery period;

after said comparing, ascertaining that the data traffic deviates from the reference data traffic pattern by more than a predefined tolerance;

deactivating the fault indicator in response to said ascertaining;

resetting the reference data traffic pattern in response to said ascertaining;

terminating said iterative looping in response to said ascertaining; and turning off the power source of the fault monitoring system in response to said ascertaining, subsequent to said deactivating, said resetting, and said terminating.

8. A computer program product, comprising a computer usable medium having a computer readable program code embodied therein, said computer readable program code containing instructions that when executed by a processor of a computer system implement a method for monitoring and instantly identifying faults in a data communication cable within a computer network, the data communication cable comprising a cable medium, a cable insulation, and a fault monitoring system, wherein the fault monitoring system comprises a sensor, a fault monitoring program, a reference data traffic pattern storage, a fault indicator, and a power source, the method comprising:

establishing a reference data traffic pattern by storing data signals into the reference data traffic pattern storage for a predefined sampling period, wherein data signals are input from the sensor;

monitoring for a fault in a data traffic communicated through the cable medium based on a comparison of the data traffic and the reference data traffic pattern;

activating the fault indicator to notify users that the fault has been detected in response to said monitoring;

checking for a recovery of the data traffic subsequent to said activating for a predefined recovery period; and iteratively looping back to said monitoring, said activating, and said checking, wherein said establishing, said monitoring, said activating, said checking and said iterative looping are performed by the fault monitoring program that runs on a computer system that is part of the fault monitoring system of the data communication cable, wherein the sensor of the fault monitoring system transmits data signals communicated through the cable medium to the fault monitoring program, wherein the fault indicator emits audio, visual, or data signals outside of the cable insulation only when the fault indicator is activated.

9. The computer program product of claim 8, wherein the predefined sampling period is functionally determined to a time value long enough to identify normalcy of communication through the data communication cable, pursuant to characteristics of the computer network.

10. The computer program product of claim 8, said monitoring comprising:

acquiring the data traffic by reading data signals from the sensor;

comparing the data traffic from said acquiring with the reference data traffic pattern stored in the reference data traffic pattern storage;

after said comparing, ascertaining that the data traffic deviates from the reference data traffic pattern by more than a predefined tolerance; and determining that the fault has been detected in response to said ascertaining.

11. The computer program product of claim 10, wherein the predefined tolerance is functionally determined to a data rate value that demonstrates normalcy of the data traffic relative to a data traffic rate of the reference data traffic pattern.

12. The computer program product of claim 8, wherein the predefined recovery period is functionally determined to a time period that is long enough to notify users of the fault and that is short enough to save the power source for a later user of the data communication cable, pursuant to characteristics of the computer network.

13. The computer program product of claim 8, said checking comprising:

comparing the data traffic to the reference data traffic pattern for a predefined sampling period during or after the predefined recovery period;

after said comparing, ascertaining that the data traffic does not deviate from the reference data traffic pattern by more than a predefined tolerance; and deactivating the fault indicator in response to said ascertaining.

14. The computer program product of claim 8, said checking comprising:

comparing the data traffic to the reference data traffic pattern for a predefined sampling period during or after the predefined recovery period;

after said comparing, ascertaining that the data traffic deviates from the reference data traffic pattern by more than a predefined tolerance;

deactivating the fault indicator in response to said ascertaining;

resetting the reference data traffic pattern in response to said ascertaining;

terminating said iterative looping in response to said ascertaining; and turning off the power source of the fault monitoring system in response to said ascertaining, subsequent to said deactivating, said resetting, and said terminating.

15. A computer system comprising a processor and a computer readable memory unit coupled to the processor, said memory unit containing instructions that when executed by the processor implement a method for monitoring and instantly identifying faults in a data communication cable within a computer network, the data communication cable comprising a cable medium, a cable insulation, and a fault monitoring system, wherein the fault monitoring system comprises a sensor, a fault monitoring program, a reference data traffic pattern storage, a fault indicator, and a power source, the method comprising:

establishing a reference data traffic pattern by storing data signals into the reference data traffic pattern storage for a predefined sampling period, wherein data signals are input from the sensor;

monitoring for a fault in a data traffic communicated through the cable medium based on a comparison of the data traffic and the reference data traffic pattern;

activating the fault indicator to notify users that the fault has been detected in response to said monitoring;

checking for a recovery of the data traffic subsequent to said activating for a predefined recovery period; and iteratively looping back to said monitoring, said activating, and said checking, wherein said establishing, said monitoring, said activating, said checking and said iterative looping are performed by the fault monitoring program that runs on a computer system that is part of the fault monitoring system of the data communication cable, wherein the sensor of the fault monitoring system transmits data signals communicated through the cable medium to the fault monitoring program, wherein the fault indicator emits audio, visual, or data signals outside of the cable insulation only when the fault indicator is activated.

16. The computer system of claim 15, wherein the predefined sampling period is functionally determined to a time value long enough to identify normalcy of communication through the data communication cable, pursuant to characteristics of the computer network.

17. The computer system of claim 15, said monitoring comprising:

acquiring the data traffic by reading data signals from the sensor;

comparing the data traffic from said acquiring with the reference data traffic pattern stored in the reference data traffic pattern storage;

after said comparing, ascertaining that the data traffic deviates from the reference data traffic pattern by more than a predefined tolerance; and determining that the fault has been detected in response to said ascertaining.

18. The computer system of claim 17, wherein the predefined tolerance is functionally determined to a data rate value that demonstrates normalcy of the data traffic relative to a data traffic rate of the reference data traffic pattern.

19. The computer system of claim 15, wherein the predefined recovery period is functionally determined to a time period that is long enough to notify users of the fault and that is short enough to save the power source for a later user of the data communication cable, pursuant to characteristics of the computer network.

20. The computer system of claim 15, said checking comprising:

comparing the data traffic to the reference data traffic pattern for a predefined sampling period during or after the predefined recovery period;

after said comparing, ascertaining that the data traffic does not deviate from the reference data traffic pattern by more than a predefined tolerance; and deactivating the fault indicator in response to said ascertaining.

21. The computer system of claim 15, said checking comprising:

comparing the data traffic to the reference data traffic pattern for a predefined sampling period during or after the predefined recovery period;

after said comparing, ascertaining that the data traffic deviates from the reference data traffic pattern by more than a predefined tolerance;

deactivating the fault indicator in response to said ascertaining;

resetting the reference data traffic pattern in response to said ascertaining;

terminating said iterative looping in response to said ascertaining; and turning off the power source of the fault monitoring system in response to said ascertaining, subsequent to said deactivating, said resetting, and said terminating.

22. A process for supporting computer infrastructure, said process comprising providing at least one support service for at least one of creating, integrating, hosting, maintaining, and deploying computer-readable code in a computing system, wherein the code in combination with the computing system is capable of performing a method for monitoring and instantly identifying faults in a data communication cable within a computer network, the data communication cable comprising a cable medium, a cable insulation, and a fault monitoring system, wherein the fault monitoring system comprises a sensor, a fault monitoring program, a reference data traffic pattern storage, a fault indicator, and a power source, the method comprising:

establishing a reference data traffic pattern by storing data signals into the reference data traffic pattern storage for a predefined sampling period, wherein data signals are input from the sensor;

monitoring for a fault in a data traffic communicated through the cable medium based on a comparison of the data traffic and the reference data traffic pattern;

activating the fault indicator to notify users that the fault has been detected in response to said monitoring;

checking for a recovery of the data traffic subsequent to said activating for a predefined recovery period; and iteratively looping back to said monitoring, said activating, and said checking, wherein said establishing, said monitoring, said activating, said checking and said iterative looping are performed by the fault monitoring program that runs on a computer system that is part of the fault monitoring system of the data communication cable, wherein the sensor of the fault monitoring system transmits data signals communicated through the cable medium to the fault monitoring program, wherein the fault indicator emits audio, visual, or data signals outside of the cable insulation only when the fault indicator is activated.

23. The process of claim 22, wherein the predefined sampling period is functionally determined to a time value long enough to identify normalcy of communication through the data communication cable, pursuant to characteristics of the computer network.

24. The process of claim 22, said monitoring comprising:
acquiring the data traffic by reading data signals from the sensor;

comparing the data traffic from said acquiring with the reference data traffic pattern stored in the reference data traffic pattern storage;

after said comparing, ascertaining that the data traffic deviates from the reference data traffic pattern by more than a predefined tolerance; and determining that the fault has been detected in response to said ascertaining.

25. The process of claim 24, wherein the predefined tolerance is functionally determined to a data rate value that demonstrates normalcy of the data traffic relative to a data traffic rate of the reference data traffic pattern.

26. The process of claim 22, wherein the predefined recovery period is functionally determined to a time period that is long enough to notify users of the fault and that is short enough to save the power source for a later user of the data communication cable, pursuant to characteristics of the computer network.

27. The process of claim 22, said checking comprising:
comparing the data traffic to the reference data traffic pattern for a predefined sampling period during or after the predefined recovery period;

after said comparing, ascertaining that the data traffic does not deviate from the reference data traffic pattern by more than a predefined tolerance; and deactivating the fault indicator in response to said ascertaining.

28. The process of claim 22, said checking comprising:
comparing the data traffic to the reference data traffic pattern for a predefined sampling period during or after the predefined recovery period;

after said comparing, ascertaining that the data traffic deviates from the reference data traffic pattern by more than a predefined tolerance;

deactivating the fault indicator in response to said ascertaining;

resetting the reference data traffic pattern in response to said ascertaining;

terminating said iterative looping in response to said ascertaining; and turning off the power source of the fault monitoring system in response to said ascertaining, subsequent to said deactivating, said resetting, and said terminating.

* * * * *